United States Patent [19]
Myers

[11] Patent Number: 5,939,927
[45] Date of Patent: Aug. 17, 1999

[54] ISOLATED PULSE MODE DRIVER FOR POWER TRANSISTOR

[75] Inventor: Richard C. Myers, McMinnville, Oreg.

[73] Assignee: Hewlett-Packard Company, Palo Alto, Calif.

[21] Appl. No.: 08/760,086

[22] Filed: Oct. 31, 1996

[51] Int. Cl.$^6$ .................................................. H03K 17/16
[52] U.S. Cl. .......................... 327/390; 327/108; 327/434; 327/589
[58] Field of Search ..................... 327/109, 110, 327/427, 432, 170, 108, 434, 325, 326, 111, 320, 389, 580, 584, 328, 390, 589

[56] References Cited

U.S. PATENT DOCUMENTS

| | | | |
|---|---|---|---|
| 5,434,527 | 7/1995 | Antone | 327/389 |
| 5,534,814 | 7/1996 | Archer | 327/427 |
| 5,635,867 | 6/1997 | Timm | 327/427 |

FOREIGN PATENT DOCUMENTS

| | | | |
|---|---|---|---|
| 360054572 | 3/1995 | Japan | 327/109 |

*Primary Examiner*—Kenneth B. Wells
*Assistant Examiner*—Hai L. Nguyen

[57] ABSTRACT

A circuit for driving a power transistor in pulse mode, particularly adapted for use in a defibrillator. The gate of the power transistor is connected to the drain of a depletion mode transistor so no charge can build up at the gate of the power transistor when the depletion mode transistor is in its normal, conducting state. An electrical path is provided which allows current to flow, in response to a control signal, so that negative charge builds up at the gate of the depletion mode transistor, causing it to switch off (non-conducting), at which point the same current flow begins to charge the gate of the power transistor, switching it on. When the current flow is reversed, the gate of the depletion mode transistor is discharged and it switches back on, causing the gate of the power transistor to also discharge and turn the power transistor off. The various components are selected such that leakage current is less than 1 $\mu$a with the resulting power pulse lasting about 25 ms. The power transistor is preferably a MOSFET or IGBT, and the depletion mode transistor is preferably a MOSFET or a JFET.

18 Claims, 1 Drawing Sheet

ISOLATED PULSE MODE DRIVER FOR POWER TRANSISTOR

BACKGROUND OF THE INVENTION

1. Field of the Invention

The present invention generally relates to electrical circuits for power control, and more particularly to an electrically isolated circuit which is used as a driver for a power MOSFET operating in a pulse mode. The invention has particular applicability in heart defibrillators.

2. Description of the Prior Art

Many electrical devices require electrical power to be delivered in short bursts, or pulses. One such device is a defibrillator which is an electronic instrument used for stopping fibrillation during a heart attack by applying controlled electric pulses to the heart muscles. These devices typically use mechanical relays to switch current to the patient, but newer defibrillators use solid state switching circuits which include a power transistor, such as a metal-oxide semiconducting, field-effect transistor (MOSFET) or an insulated gate bipolar transistor (IGBT). In this type of circuit, the power transistor must be held off under normal conditions, and is turned on for only a very short duration to deliver energy to the patient.

A conventional circuit 10 used to drive a power transistor is shown in FIG. 2. In this circuit, an enhancement mode transistor 12 (MOSFET) is used to control the power transistor 14 (either a power MOSFET or IGBT). Transistor 12 is normally off, i.e., it does not conduct across its drain and source leads in its unenergized state. In order to turn transistor 12 on, and thereby hold power transistor 14 in its off state, a positive charge must be applied to the gate of transistor 12. This is accomplished when input transistor 16 turns off, charging capacitor 18 via a low voltage (e.g., 12 volt) power source and resistor 20. Secondary current is induced in a transformer 22 due to the magnetizing energy stored in the transformer, and flows from another capacitor 24 through a rectifier 26, and thence to the secondary windings of transformer 22 and back to capacitor 24. When transistor 16 is subsequently turned on, the voltage across capacitor 18 is applied across the primary winding of transformer 22. Secondary current will flow from capacitor 24 and another rectifier 28 to the secondary windings of transformer 22, and through a zener diode 30 and rectifier 32, thence to transistor 12 and back to capacitor 24. Capacitor 24 will discharge, turning transistor 12 off and allowing the gate of transistor 14 to charge and turn transistor 14 on, thereby powering the load 36. The charge on the gate of transistor 14 is limited by zener diode 34.

The charge applied to the gate of transistor 12 bleeds off fairly quickly due to leakage currents. Accordingly, this circuit is acceptable for use as a high frequency switcher, say in the range of 1 kHz to 100 kHz, which allows capacitor 24 to be charged and discharged on each pulse, and it provides electrical isolation across the transformer. This circuit is not, however, suitable for use with a defibrillator since a typical pulse may last as long as 25 ms. Also, in this prior art circuit, the resting state of the enhancement mode transistor 12 is off, meaning the gate of the power transistor 14 is at a high impedance state. In this state, any sort of noise on the gate (such as an electrostatic discharge event) would tend to turn the power transistor on. It would, therefore, be desirable and advantageous to devise a driver for a power transistor which could be configured as a high side driver and provide electrical isolation, but is further suitable for use with power-on pulses as long as or larger than 25 ms and also uses a driver whose default (resting) state holds the power transistor off, so that it is less likely to be triggered in a noisy environment.

SUMMARY OF THE INVENTION

It is therefore one object of the present invention to provide an improved circuit for driving a power transistor.

It is another object of the present invention to provide such a circuit which can be configured as a high side driver and provide electrical isolation.

It is yet another object of the present invention to provide such a circuit which is suitable for power-on pulses in the range of 10 μs to 50 ms.

The foregoing objects are achieved in a pulse mode driver generally comprising a power transistor, a depletion mode transistor having a drain connected to the gate of the power transistor, and an electrical path providing current flow from the source of the depletion mode transistor, across a capacitor, and to the drain of the depletion mode transistor. When current flows in this direction, negative charge builds up at the gate of the depletion mode transistor, causing it to switch off, and to begin charging the gate of the power transistor, switching it on. When current flow is reversed, the gate of the depletion mode transistor is discharged and it switches back on, causing the gate of the power transistor to also discharge and turn the power transistor off. Reverse current flow may be achieved along a path wherein the source of the depletion mode transistor is connected to the source of the power transistor, and both sources are further connected (across a rectifier) to the capacitor and gate of the depletion mode transistor. The various components are selected such that the resulting power pulse lasts about 25 ms. The power transistor is preferably a MOSFET or IGBT, and the depletion mode transistor is preferably a MOSFET or a JFET. Current may be induced in the pulse mode driver by providing a transformer with a secondary winding forming part of the electrical path, to isolate the control electronics from the power supply.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DESCRIPTION OF THE PREFERRED EMBODIMENT

Figure 1:
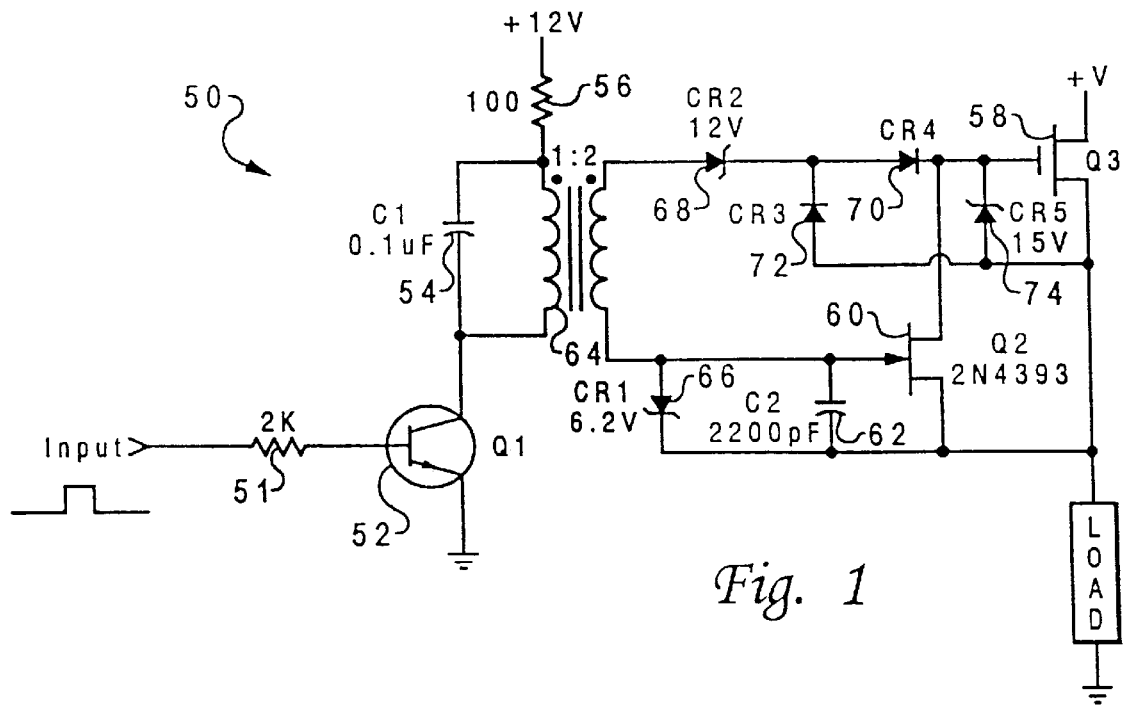
FIG. 1 is a schematic diagram of an electrical circuit forming a driver for a power transistor according to the present invention.
Figure 2:
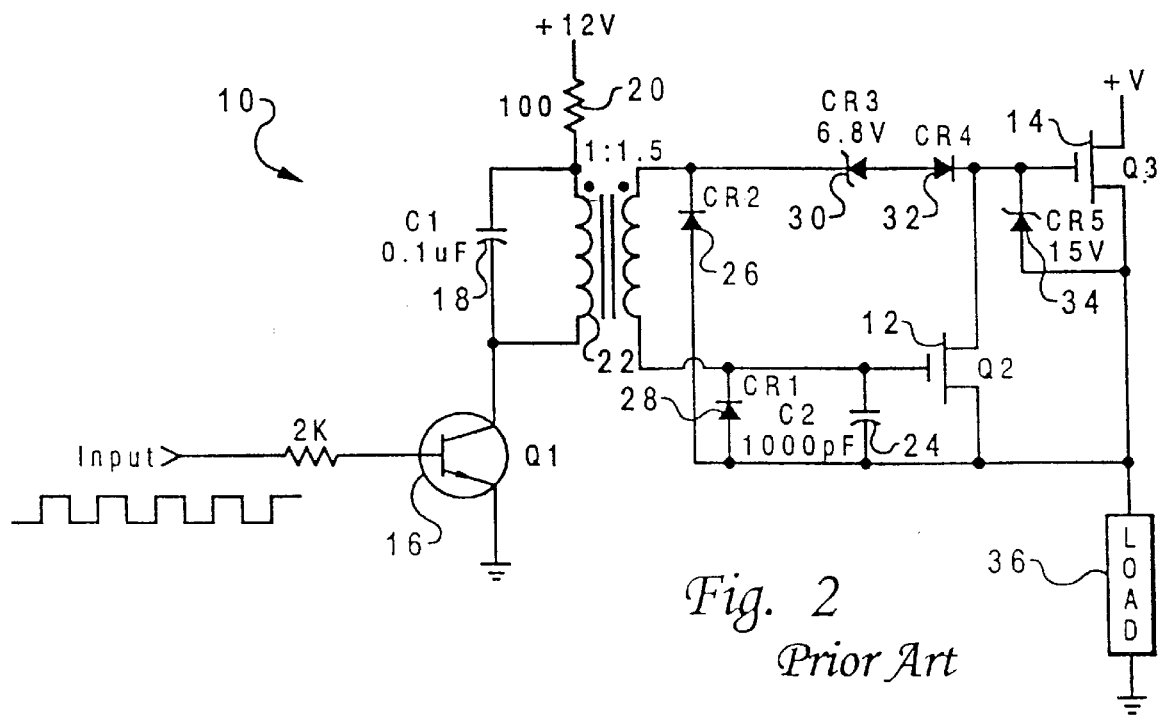
FIG. 2 is a schematic diagram of a prior art electrical circuit for driving a power transistor.

With reference now to the figures, and in particular with reference to FIG. 1, there is depicted the isolated pulse mode driver circuit 50 of the present invention. Driver circuit 50 includes an input resistor 51 and a control transistor 52 connected to a capacitor 54 which is charged via a low-voltage (12 volt) power source and a limiting resistor 56. Circuit 50 also includes a power transistor 58, but it is now controlled by a depletion mode transistor 60, such as a MOSFET or JFET (junction field-effect transistor). Depletion mode transistors are normally on, that is, they conduct current across the drain and source in their unenergized state, but when the gate is charged (energized) current flow is blocked.

When the voltage across capacitor 62 is zero, then transistor 60 is on, and power transistor 58 is off. When control transistor 52 is turned on via the input signal, voltage across capacitor 54 is applied across the primary winding of transformer 64. Secondary current will flow from capacitor 62 and zener diode 66 through the secondary winding of transformer 64, to zener diode 68 and rectifier 70, then to transistor 60 and back to capacitor 62. Capacitor 62 will accordingly charge to a negative voltage, limited by zener diode 66, turning transistor 60 off. When this happens, current flow changes to the following path: from capacitor 62 in parallel with zener diode 66 through the secondary winding of transformer 64, to zener diode 68 and rectifier 70, then to transistor 58 and back to capacitor 62. This will charge the gate-to-source capacitance of transistor 58, turning it on. The voltage at the gate-to-source capacitor is limited by a zener diode 74. Transistor 58 is thereafter held on since there is no path to discharge the voltage on the gate-to-source capacitance. Leakage current will eventually discharge the gate-to-source capacitor of transistor 58, but as long as the leakage is low (below about 1 $\mu$A), transistor 58 should stay on for about 25 ms. This time period is more than adequate for a defibrillator pulse (typically less than 15 ms). The output of the circuit (the source lead on transistor 58) is adapted to be connected to an appropriate defibrillation electrode.

When transistor 52 thereafter is turned off, the magnetizing energy stored in the transformer is coupled to the secondary, causing current to flow through rectifier 72 to zener diode 68, to the secondary winding of transformer 64, thence to zener diode 66 and capacitor 62, and back to rectifier 72. This flow will discharge capacitor 62 and, when it approaches zero volts, transistor 60 turns back on, shorting out the gate-to-source capacitor of transistor 58 which will thereby switch off. Zener diode 68 keeps the gate of power transistor 58 near 12 volts until transistor 60 turns on.

The power source +V for transistor 58 can be any voltage less than the breakdown of the power transistor (~1,200 volts). The circuitry providing input to transistor 52 most preferably provides a pulse of about 5 ms, and the switching circuit operates in the 10 $\mu$s–50 ms range. Conventional circuits and components are used to provide the input signal and power.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A device for providing pulsed power output to a defibrillator, comprising:

a power supply;

a power transistor having a gate, a drain and a source, said drain of said power transistor being connected to said power supply, said source of said power transistor being coupled to a defibrillation electrode;

a capacitor having first and second leads;

a depletion mode transistor having a gate, a drain and a source, said drain of said depletion mode transistor being connected to said gate of said power transistor, said source of said depletion mode transistor being connected to said first lead of said capacitor, and said gate of said depletion mode transistor being connected to said second lead of said capacitor, and said source of said depletion mode transistor further being connected to said source of said power transistor;

a transformer having primary and secondary windings, each of said windings having first and second leads, said first lead of said secondary winding being connected to said second lead of said capacitor;

a rectifier having first and second leads, said first lead of said rectifier being connected to said second lead of said secondary winding, and said second lead of said rectifier being connected to said gate of said power transistor, allowing current to flow from said secondary winding to said gate of said power transistor;

means for creating current flow in said primary winding to induce a current in said secondary winding sufficient to charge said gate of said depletion mode transistor and cause it to switch off and thereafter charge said gate of said power transistor and cause it to switch on; and a second rectifier having first and second leads, said first lead of said second rectifier being connected to said source of said power transistor, and said second lead of said second rectifier being connected to said second lead of said secondary winding.

2. The device of claim 1 wherein said depletion mode transistor is selected from the group consisting of a MOSFET and a JFET.

3. The device of claim 1 wherein said power transistor remains switched on for at least 10 $\mu$s.

4. The device of claim 1 wherein charging of said capacitor is limited by a zener diode connected in parallel with said capacitor between said first lead of said secondary winding and said source of said depletion mode transistor.

5. The device of claim 1 wherein said means for creating current flow in said primary winding comprises:

a bipolar transistor having a base, a collector, and an emitter, said collector being connected to said first lead of said primary winding;

an input line connected to said base for selectively switching said bipolar transistor between on and off states;

a ground plane connected to said emitter;

a second capacitor having first and second leads, said first lead of said second capacitor being connected to said collector, and said second lead of said second capacitor being connected to said second lead of said primary winding;

a low voltage power source; and a resistor having first and second leads, said first lead of said resistor being connected to said low voltage power source and said second lead of said resistor being connected to said second lead of said second capacitor.

6. The device of claim 1 wherein said power transistor is selected from the group consisting of a MOSFET and an IGBT.

7. A pulse mode circuit for driving a power transistor having a gate, a drain and a source, the circuit comprising:

transistor means for selectively conducting or blocking current flow, wherein current flow is conducted across the transistor means during unenergized operation, and current flow is blocked across the transistor means during energized operation, said transistor means having a first lead for connection to the gate of the power transistor and having a second lead for connection to the source of the power transistor;

means for energizing said transistor means, wherein said energizing means energizes said transistor means as a result of current flow across said transistor means from said first lead to said second lead thereof;

an electrical path providing current flow from said second lead of said transistor means, through said energizing means and to said first lead of said transistor means such that, when said transistor means is energized and blocking current flow, said energizing means energizes the gate to turn the power transistor on.

8. The pulse mode circuit of claim 7 further comprising means for inducing current in said electrical path, said current inducing means being electrically isolated from the power transistor.

9. The pulse mode circuit of claim 7 wherein said energizing means comprises a capacitor.

10. The pulse mode circuit of claim 8 wherein said means for inducing current comprises:

a bipolar transistor having a base, a collector, and emitter;

an input line connected to said base for selectively switching said bipolar transistor between on and off states;

a ground plane connected to said emitter;

a capacitor having first and second leads, said first lead being connected to said collector;

a low voltage power source;

a resistor having first and second leads, said first lead of said resistor being connected to said low voltage power source and said second lead of said resistor being connected to said second lead of said capacitor; and a transformer having a primary winding connected in parallel with said capacitor between said second lead of said resistor and said collector, and a secondary winding constituting a portion of said electrical path.

11. The pulse mode circuit of claim 7 further comprising a second electrical path providing current flow from said energizing means through a rectifier and back to said energizing means, such that said energizing means returns said transistor means to an unenergized state as a result of current flow through said second electrical path.

12. A pulse mode circuit for driving a power transistor having a gate, a drain and a source, the circuit comprising:

transistor means for selectively conducting or blocking current flow, wherein current flow is conducted across the transistor means during unenergized operation, and current flow is blocked across the transistor means during energized operation, said transistor means having a first lead for connection to the gate of the power transistor and having a second lead for connection to the source of the power transistor;

means for energizing said transistor means;

an electrical path providing current flow from said second lead of said transistor means, through said energizing means and to said first lead of said transistor means such that, when said transistor means is energized and blocking current flow, said energizing means energizes the gate to turn the power transistor on;

means, connected in parallel with said energizing means, for limiting voltage across said energizing means.

13. The pulse mode circuit claim 12 wherein said energizing means comprises a capacitor.

14. The pulse mode circuit of claim 12 further comprising a second electrical path providing current flow from said energizing means through a rectifier and back to said energizing means, such that said energizing means returns said transistor means to an unenergized state as a result of current flow through said second electrical path.

15. A pulse mode circuit for driving a power transistor having a gate, a drain and a source, the circuit comprising:

a first depletion mode, field-effect transistor for selectively conducting or blocking current flow, wherein current flow is conducted across the first transistor during unenergized operation, and current flow is blocked across the first transistor during energized operation, said first transistor having a first lead for connection to the gate of the power transistor and having a second lead for connection to the source of the power transistor;

means for energizing said first transistor;

an electrical path providing current flow from said second lead of said first transistor, through said energizing means and to said first lead of said first transistor such that, when said first transistor is energized and blocking current flow, said energizing means energizes the gate to turn the power transistor on.

16. The pulse mode circuit of claim 15 wherein said first transistor is a JFET.

17. The pulse mode circuit of claim 15 wherein said energizing means comprises a capacitor.

18. The pulse mode circuit of claim 15 further comprising a second electrical path providing current flow from said energizing means through a rectifier and back to said energizing means, such that said energizing means returns said transistor means to an unenergized state as a result of current flow through said second electrical path.

* * * * *